10,XR 3,967,029

United States Patent [19]
Veltri et al.

[11] 3,967,029
[45] June 29, 1976

[54] BORON-CARBON ALLOY TAPE

[75] Inventors: Richard D. Veltri, East Hartford, Conn.; Roy Fanti, Springfield, Mass.; Francis Salvatore Galasso, Manchester, Conn.

[73] Assignee: United Technologies Corporation, Hartford, Conn.

[22] Filed: Mar. 2, 1973

[21] Appl. No.: 337,358

[52] U.S. Cl. .............................. 428/216; 427/249; 428/408; 428/538; 428/902
[51] Int. Cl.² .......................................... C23C 11/00
[58] Field of Search ..... 117/106 C, 106 R, DIG. 10, 117/DIG. 11, 228, 107.2 R, 107.1; 427/249; 428/216, 408, 538, 902

[56] References Cited
UNITED STATES PATENTS

| | | |
|---|---|---|
| 3,334,967 | 8/1967 | Bourdeau .................... 117/106 C X |
| 3,369,920 | 2/1968 | Bourdeau et al. ........ 117/DIG. 10 X |
| 3,464,843 | 9/1969 | Basche ........................ 117/106 C X |
| 3,553,003 | 1/1971 | Carlton et al. .................. 117/106 C |
| 3,556,834 | 1/1971 | Gebhardt ..................... 117/169 R X |
| 3,627,571 | 12/1971 | Cass et al. ................. 117/DIG. 11 X |
| 3,668,006 | 6/1972 | Higgins et al. .............. 117/106 C X |
| 3,671,285 | 6/1972 | Prescott .................... 117/DIG. 10 X |
| 3,671,306 | 6/1972 | Allen............................ 117/106 C X |
| 3,702,261 | 11/1972 | Peakes et al. ................ 117/106 C X |
| 3,811,927 | 5/1974 | Joo et al. ...................... 117/106 C X |
| 3,867,191 | 2/1975 | Galasso et al............. 117/DIG. 10 X |

*Primary Examiner*—Harris A. Pitlick
*Attorney, Agent, or Firm*—John D. Del Ponti

[57] ABSTRACT

A high strength composite tape suitable for use as a reinforcement in metal or resin matrices comprising a carbon tape substrate having a continuous, essentially amorphous boron-carbon alloy coating adhered thereto.

6 Claims, 2 Drawing Figures

U.S. Patent    June 29, 1976    3,967,029
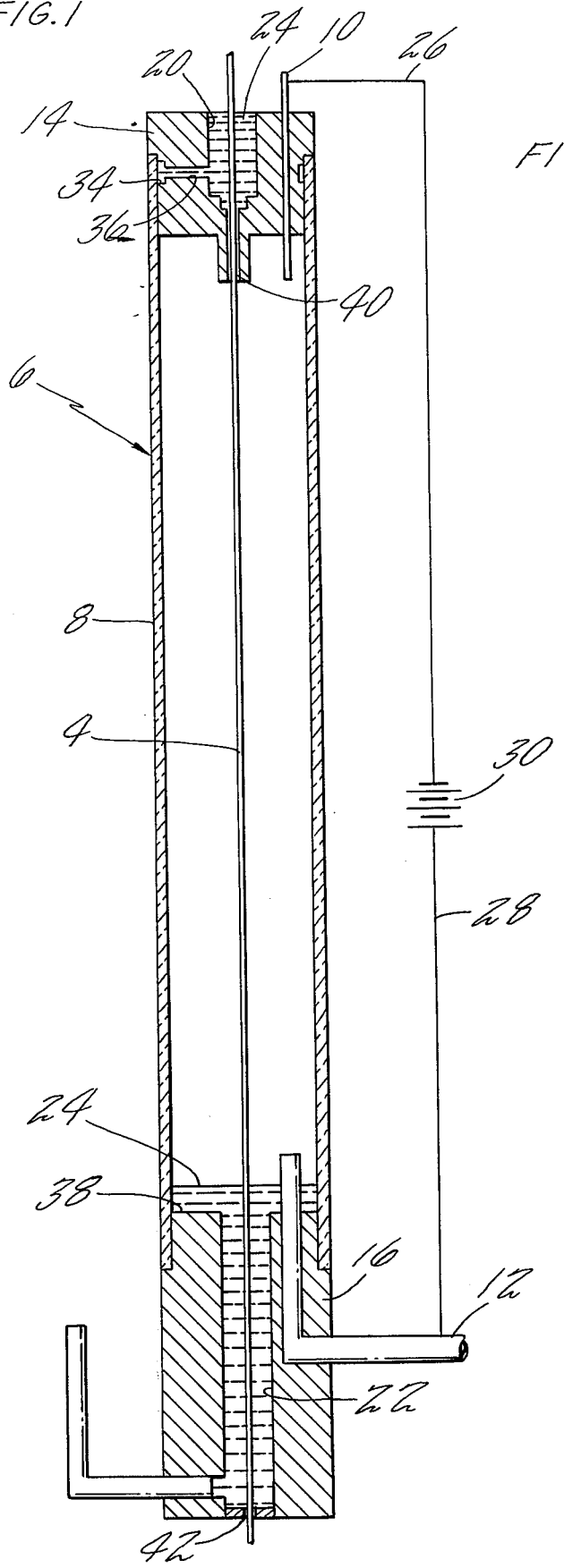
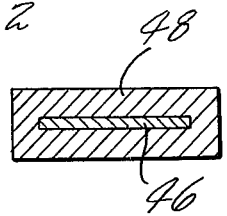

BORON-CARBON ALLOY TAPE

BACKGROUND OF THE INVENTION

The present invention relates to carbon tapes adapted for use as a substrate in the production of structural composite tapes and/or as structural composite tapes and also relates to a process for producing the same.

In the evolution of advanced composite materials, there has been an increasing demand for more efficient structural materials in view of the ever-increasing performance capabilities of aerospace vehicles and components. More specifically, the demand has focused on materials of construction of high strength-to-weight and high modulus-to-weight ratios which can be embodied in aerospace applications. While filament reinforced composites, particularly those reinforced with such high strength, high modulus, low density filaments as graphite, boron, silicon carbide and silicon carbide coated boron and the like are recognized as being useful in aerospace structures, the generally anisotropic properties of the unidirectionally reinforced tapes as well as the relatively complicated procedures for producing them wherein the handling of large numbers of individual filaments is required, has occasioned the search for other reinforcing modes.

SUMMARY OF THE INVENTION

The present invention relates to boron-carbon alloy tapes and, more particularly, to boron-carbon alloy tapes at least one mil in thickness suitable for use as reinforcement for metal matrix composites.

The present invention contemplates the production of a high strength, high modulus composite tape comprising a carbon tape substrate at least ½ mil in thickness, having an adherent continuous and uniform essentially amorphous coating consisting essentially of a boron-carbon alloy, preferably consisting of approximately 15–40 atomic percent carbon, more preferably 20–30 percent carbon and most preferably 28 percent carbon, remainder boron. It has been found that such a boron-carbon alloy coating composition to a thickness of approximately ½–2 mils will impart high strength and modulus to the carbon tape with essentially no twisting or distortion. For the purposes of this invention, the word tape means a generally elongated continuous material having a width-to-thickness ratio of at least 5 to 1, the term high strength means at least 100,000 psi and the term high modulus means at least $30 \times 10^6$ psi.

The present invention includes the method for making such a tape either statically or continuously and in general, preferably comprises continuously passing a carbon tape through a reactor, heating the tape to 1050°–1250°C and exposing the heated tape to a reactant gas flow containing carbon and boron. The reactant gas flow may consist essentially of a carbon-containing gas such as methane, a boron-containing gas such as a boron halide, e.g. boron trichloride or a carbon and boron containing gas such as organoborane-ethylene, and a diluent gas such as hydrogen. In the preferred embodiment utilizing $CH_4$, $BCl_3$ and $H_2$, the mass flow ratios of the methane/boron trichloride and hydrogen/boron trichloride are 0.5–10 and 0.5–2, respectively and most preferably each being unity.

BRIEF DESCRIPTION OF THE DRAWING

An understanding of the invention will become more apparent to those skilled in the art by reference to the following detailed description when viewed in light of the accompanying drawing, wherein:

FIG. 1 is an elevational view of apparatus used in the production of the boron-carbon alloy coating of the carbon tapes of the present invention; and FIG. 2 is an enlarged cross-sectional view through one of the tapes of the present invention.

DESCRIPTION OF THE PREFERRED EMBODIMENT

As seen in FIG. 1, the boron-carbon alloy coating is produced on a resistively heated carbon tape 4 which may be held statically in or, more preferably, is drawn downwardly through a reactor 6 comprising a tubular containment vessel 8 having a gas inlet 10 at the upper end of the reactor and a single exhaust port 12 at the lower end thereof. A reactant gas mixture consisting essentially of methane, boron trichloride and hydrogen is fed to the reactor through inlet 10. The containment vessel may be formed of Pyrex, although a number of other materials including Vycor and quartz will be found satisfactory. The gas inlet 10 and the exhaust 12 penetrate and are electrically connected to the metallic end plugs 14 and 16 which provide the end closures for the containment for the vessel and also provide convenient means by which power may be supplied to the tape for resistance heating purposes.

The end plugs are each respectively provided with a well 20 and 22, for containing a suitable conductive sealant 24 such as mercury, which serves the dual purpose of providing a gas seal around the tape where it penetrates the end plugs, and further providing electrical contact between the moving tape and the respective end plugs which are in turn electrically connected through the tubes 10 and 12 and the leads 26 and 28 to a suitable DC power source 30. The upper plug 14 is provided with a peripheral groove 34, which communicates with the mercury well 20 through the passageway 36 to provide peripheral sealing around the plug. Sealing between the end plug 16 and the lower end of the containment vessel 6 is provided by mercury contained in an annular well 38.

The respective plugs are each formed with a centrally oriented orifice 40 and 42 which is large enough to accommodate the free passage of the tape 4 therethrough but which, in combination with the tape is small enough to retain the mercury through surface tension forces in their respective wells.

The hydrogen is considered necessary in the reactant mixture since it acts not only as a coolant for the end plugs 14 and 16 but also acts to even temperature distribution and to catalyze the methane reaction. In practice, the relative proportions expressed in flow rate ratios of the constituent methane and boron trichloride gases are critical to the formation of useful tapes. It is considered, for example, that with the hydrogen/boron trichloride ratio in the range of 0.5–2, preferably at 1, the methane/boron trichloride ratio must be greater than 0.5 but less than approximately 10 and preferably 1. If the mass flow ratio of methane/boron trichloride is greater than 10, boron-carbon deposition results but the tapes are so embrittled that they cannot be handled without breaking.

By utilizing various gas flow rates, relative amounts of boron-carbon in the coating layer may be varied. At the optimum ratios, tapes with a coating of B (20–30 percent C) had an average tensile strength of 300,000 psi and Young's modulus of $40 \times 10^6$ psi. As shown in FIG. 2, passage through the reactor results in a composite tape comprising a carbon tape core 46 having a relatively thick adherent coating of essentially amorphous boron-carbon 48. The term "essentially amorphous" for purposes of the present invention is intended to mean that degree of amorphousness which is represented by the appearance of one or two halos in the x-ray pattern of an x-ray defraction study. Subsequent to the formation of the boron-carbon layer, the tapes may be embedded in a desired resin or metal matrix material by such standard techniques as resin impregnation, plasma spraying, liquid infiltration or powder metallurgy.

Various process techniques and parameters may be utlized in producing tapes of the present invention, as indicated by the following examples.

EXAMPLE I

In a reactor of the type illustrated utilizing a 3 inch long reactor formed from 10 mm Pyrex tubing and a reactant gas mixture of methane, boron trichloride and hydrogen, a boron-carbon alloy coating was produced on a continuous carbon tape one mil thick and five mils wide. The carbon tape was produced from a continuous length of DuPont Kapton H polyimide film which was continuously passed through a 42 inch long carbonization tube having a temperature gradient of from 450°–1250°C at a speed of 20 feet per hour under a nitrogen atmosphere. During carbonization, the tape was maintained under sufficient tension to ensure flat winding around the take-up spool.

The gas flows in the FIG. 1 reactor were: boron trichloride 250 cc/min, methane 250 cc/min and hydrogen 250 cc/min. The tape was resistively heated, utilizing 75 volts and 600 milliamps at a power setting of 45 watts, to a temperature of 1110°C for 15 minutes and achieved a final thickness of 3.3 mils and a width of 8 mils. Several runs were made and the average UTS of the tape was 300,000 psi and the modulus was $40 \times 10^6$ psi. The coating was subjected to electron microprobe analysis as well as x-ray diffraction studies and found to consist essentially of an adherent essentially amorphous boron-carbon alloy layer consisting essentially of 30 atomic percent C, 70 percent B.

EXAMPLE II

The same apparatus and conditions were utilized as in Example I except that the reactor was modified with electrodes suitable for insertion of wider tapes and a ⅛ inch wide carbon tape was used. The resulting tape was 4 mils thick and 128 mils wide and was relatively flat. The coating, as in Example I, was adherent, essentially amorphous boron-carbon alloy consisting essentially of 28 percent C, 72 percent B.

EXAMPLE III

A nylon foil tape 3 mils thick and 90 mils wide was stabilized by oxidation treatment at a temperature of 225°C for 60 hours and then carbonized at approximately 750°C. The resulting carbon tape was flexible and conductive, having a resistance of 750 ohms per inch.

Using the apparatus of Example I, the carbon tape is heated to a temperature of 1160°C and exposed to a gas flow of 174 cc/min boron trichloride, 407 cc/min methane and 174 cc/min hydrogen for 15 minutes. A tape 8 mils thick and 93 mils wide was produced with the adherent, essentially amorphous boron-carbon alloy layer consisting essentially of 34 atomic percent C, 66 percent B. This tape was smooth and flat with no cracks.

It will be appreciated that other organic precursors such as polyacrilonitrile or polypropylene or the like may be carbonized and used as substrates to receive the boron-carbon alloy coating. The resulting boron-carbon coated carbon tapes are suitable for use in the reinforcement of resin matrices such as epoxy, or metal matrices such as, for example, aluminum, magnesium and when properly coated, titanium and nickel.

By means of the present invention, it will be appreciated that a composite tape has been provided which significantly improves the potential utility of carbon in reinforced structures, particularly insofar as isotropy and selection of matrix materials is concerned.

What has been set forth above is intended primarily as exemplary to enable those skilled in the art in the practice of the invention and it should therefore be understood that, within the scope of the appended claims, the invention may be practiced in ways other than as specifically described.

What is claimed is:
1. A high strength composite tape at least one mil in thickness suitable for use as a reinforcement in resin or metal matrix composite articles comprising:
   a substrate consisting essentially of carbon tape; and
   a continuous coating adhered to the entire surface of said substrate consisting essentially of boron-carbon alloy, said coating consisting essentially of 15–40 atomic percent carbon, remainder boron.
2. The composite tape of claim 1 wherein said carbon tape substrate is at least ½ mil thick and said boron-carbon alloy coating is at least approximately ½ mil thick.
3. The composite tape of claim 1 wherein said alloy coating consists essentially of approximately 20–30 atomic percent carbon, remainder boron.
4. The composite tape of claim 1 wherein said alloy coating consists essentially of approximately 28 atomic percent carbon, remainder boron.
5. The composite tape of claim 3 wherein said carbon tape substrate is at least ½ mil thick and said boron-carbon alloy coating is at least approximately ½ mil thick.
6. The composite tape of claim 4 wherein said carbon tape substrate is at least ½ mil thick and said boron-carbon alloy coating is at least approximately ½ mil thick.

* * * * *